United States Patent
Nagaraj et al.

(10) Patent No.: US 9,197,238 B1
(45) Date of Patent: Nov. 24, 2015

(54) ADAPTIVE CLOCKING FOR ANALOG-TO-DIGITAL CONVERSION

(71) Applicant: Texas Instruments Incorporated, Dallas, TX (US)

(72) Inventors: Krishnaswamy Nagaraj, Plano, TX (US); Joonsung Park, Dallas, TX (US); Ajay Kumar, Phoenix, AZ (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/478,513

(22) Filed: Sep. 5, 2014

(51) Int. Cl.
- *H03M 1/10* (2006.01)
- *H03M 1/38* (2006.01)
- *H03M 1/12* (2006.01)
- *H03L 7/08* (2006.01)

(52) U.S. Cl.
CPC . *H03M 1/38* (2013.01); *H03L 7/08* (2013.01); *H03M 1/1009* (2013.01); *H03M 1/1255* (2013.01)

(58) Field of Classification Search
CPC ....... H03M 1/38; H03M 1/009; H03M 1/255; H03L 7/08
USPC ............... 341/161, 163, 155, 118, 120, 144
See application file for complete search history.

(56) References Cited

U.S. PATENT DOCUMENTS

| | | | | |
|---|---|---|---|---|
| 7,557,648 | B2 * | 7/2009 | Okuyama | 330/9 |
| 7,705,763 | B2 * | 4/2010 | Kuramochi et al. | 341/161 |
| 8,912,941 | B2 * | 12/2014 | Tokunaga | 341/155 |
| 2010/0013693 | A1 * | 1/2010 | Kuramochi et al. | 341/166 |
| 2013/0214946 | A1 * | 8/2013 | Verbruggen et al. | 341/118 |

* cited by examiner

*Primary Examiner* — Peguy Jean Pierre
(74) *Attorney, Agent, or Firm* — John R. Pessetto; Frank D. Cimino

(57) ABSTRACT

An analog-to-digital conversion system and method includes, for example, a comparator for sampling an analogy quantity during a sampling period and for performing a series of bit-wise conversions on the sampled analog sample during a conversion period, where each bit-wise conversion occurs during a respective bit-wise conversion cycle in which successive bits of a sample are successively determined during a respective bit conversion cycle and in which a predetermined number of bit-wise conversions are to be performed. A clock generator is arranged for generating a clock signal for clocking the converter during the conversion period, wherein each bit conversion cycle includes a reset period having a first length and an amplification period having a second length, wherein one of the first and second lengths is dynamically selected.

16 Claims, 5 Drawing Sheets

US 9,197,238 B1

ADAPTIVE CLOCKING FOR ANALOG-TO-DIGITAL CONVERSION

BACKGROUND

Successive approximation register (SAR) analog-to-digital converters (ADC) determine each bit of a sampled value in a serial manner. An ADC clock signal is used to drive the SAR ADC operation. The frequency of the ADC clock signal is a function of the sampling frequency and the number of cycles required per sample. Often, the ADC clock signal is derived from a phase lock loop (PLL) that is formed in the substrate of a system-on-chip (SOC). However, the frequencies used for optimal conversions for various applications are often difficult to meet using the limited selection of frequencies that can be derived from a PLL that is (e.g., beforehand) designed into an SOC.

SUMMARY

The problems noted above can be addressed in an analog-to-digital system and method that includes, for example, a comparator for performing a series of bit-wise conversions on an sampled analog sample during a normal conversion period, where each bit-wise conversion occurs during a respective bit-wise conversion cycle and a predetermined number of bit-wise conversions are to be performed. A clock generator is arranged for generating a clock signal for clocking the converter during the normal conversion period, wherein each bit conversion cycle includes a reset period having a first length and an amplification period having a second length, wherein the first and second lengths can be dynamically selected during normal operation.

This Summary is submitted with the understanding that it is not be used to interpret or limit the scope or meaning of the claims. Further, the Summary is not intended to identify key features or essential features of the claimed subject matter, nor is it intended to be used as an aid in determining the scope of the claimed subject matter.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be example of that embodiment, and not intended to intimate that the scope of the disclosure, including the claims, is limited to that embodiment.

Certain terms are used throughout the following description—and claims—to refer to particular system components. As one skilled in the art will appreciate, various names may be used to refer to a component or system. Accordingly, distinctions are not necessarily made herein between components that differ in name but not function. Further, a system can be a sub-system of yet another system. In the following discussion and in the claims, the terms "including" and "comprising" are used in an open-ended fashion, and accordingly are to be interpreted to mean "including, but not limited to . . . ." Also, the terms "coupled to" or "couples with" (and the like) are intended to describe either an indirect or direct electrical connection. Thus, if a first device couples to a second device, that connection can be made through a direct electrical connection, or through an indirect electrical connection via other devices and connections. The term "portion" can mean an entire portion or a portion that is less than the entire portion. The term "calibration" can include the meaning of the word "test." The term "input" can mean either a source or a drain (or even a control input such as a gate where context indicates) of a PMOS (positive-type metal oxide semiconductor) or NMOS (negative-type metal oxide semiconductor) transistor. The term "pulse" can mean a portion of waveforms such as periodic waveforms.

Figure 1:
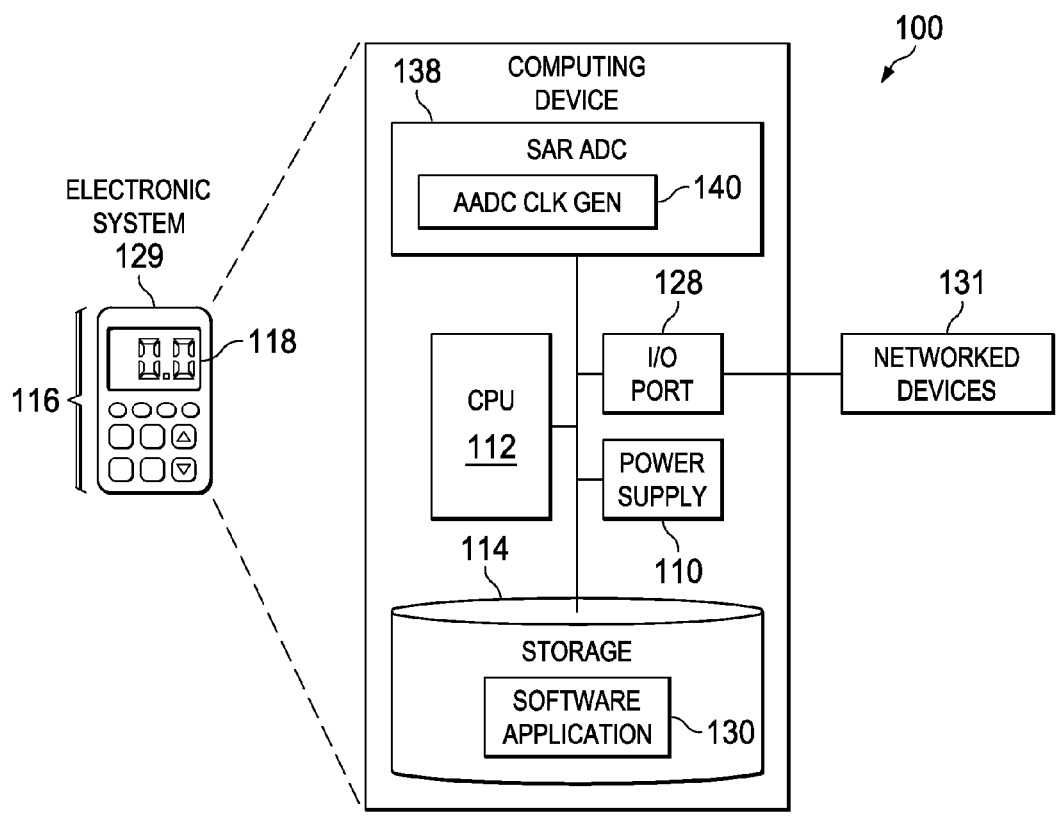
FIG. 1 shows an illustrative electronic device in accordance with example embodiments of the disclosure.

FIG. 1 shows an illustrative computing device 100 in accordance with preferred embodiments of the disclosure. For example, the computing device 100 is, or is incorporated into, an electronic system 129, such as a computer, electronics control "box" or display, communications equipment (including transmitters), or any other type of electronic system arranged to generate radio-frequency signals.

In some embodiments, the computing device 100 comprises a megacell or a system-on-chip (SoC) which includes control logic such as a CPU 112 (Central Processing Unit), a storage 114 (e.g., random access memory (RAM)) and a power supply 110. The CPU 112 can be, for example, a CISC-type (Complex Instruction Set Computer) CPU, RISC-type CPU (Reduced Instruction Set Computer), MCU-type (Microcontroller Unit), or a digital signal processor (DSP). The storage 114 (which can be memory such as on-processor cache, off-processor cache, RAM, flash memory, or disk storage) stores one or more software applications 130 (e.g., embedded applications) that, when executed by the CPU 112, perform any suitable function associated with the computing device 100.

The CPU 112 comprises memory and logic that store information frequently accessed from the storage 114. The computing device 100 is often controlled by a user using a UI (user interface) 116, which provides output to and receives input from the user during the execution the software application 130. The output is provided using the display 118, indicator lights, a speaker, vibrations, and the like. The input is received using audio and/or video inputs (using, for example, voice or image recognition), and electrical and/or mechanical devices such as keypads, switches, proximity detectors, gyros, accelerometers, and the like. The CPU 112 is coupled to I/O (Input-Output) port 128, which provides an interface that is configured to receive input from (and/or provide output to) networked devices 131. The networked devices 131 can include any device (including key fobs or base-station control modules that are electronically paired with the computing device 100) capable of point-to-point and/or networked communications with the computing device 100. The computing device 100 can also be coupled to peripherals and/or computing devices, including tangible, non-transitory media (such as flash memory) and/or cabled or wireless media. These and other input and output devices are selectively coupled to the computing device 100 by external devices using wireless or cabled connections. The storage 114 can be accessed by, for example, by the networked devices 131.

The CPU 112 is coupled to I/O (Input-Output) port 128, which provides an interface that is configured to receive input from (and/or provide output to) peripherals and/or computing devices 131, including tangible (e.g., "non-transitory") media (such as flash memory) and/or cabled or wireless media (such as a Joint Test Action Group (JTAG) interface). These and other input and output devices are selectively coupled to the computing device 100 by external devices using wireless or cabled connections. The CPU 112, storage 114, and power supply 110 can be coupled to an external power supply (not shown) or coupled to a local power source (such as a battery, solar cell, alternator, inductive field, fuel cell, capacitor, and the like).

The disclosed adaptive clock analog-to-digital conversion techniques address, for example, issues of adapting (including optimizing) ADC clock signals for various applications. An example adaptive (clocking) analog-to-digital conversion (ADC) system includes an adaptable internal oscillator whose frequency can be adapted in operation to any frequency that is suitable for an (e.g., arbitrary) ADC application, independent of the system clock.

The computing device 100 includes a successive approximation register (SAR) adaptive analog-to-digital converter (ADC) 138 that is arranged to determine each bit of a sampled value in a serial manner in response to an adaptive ADC clock signal. The ADC clock signal is generated by an adaptive ADC clock generator 140. As discussed below, the adaptive clock generator 140 is an automatic frequency tuning oscillator that can be set to and maintain a desired frequency and duty cycle. The frequency and duty cycle of the adaptive clock generator 140 can be dynamically optimized for best power/performance optimization of the ADC.

Figure 2:
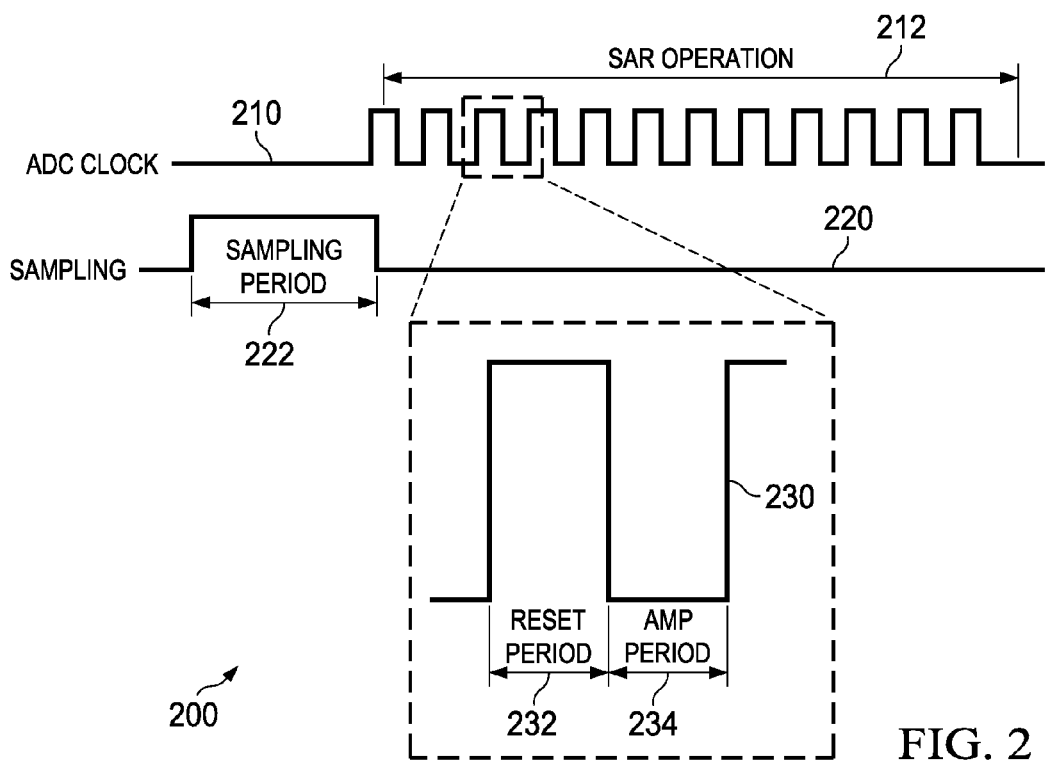
FIG. 2 is a waveform diagram illustrating waveforms used for adaptive clocking for analog-to-digital conversion in accordance with example embodiments of the disclosure.

FIG. 2 is a waveform diagram illustrating waveforms used for adaptive clocking for analog-to-digital conversion in accordance with example embodiments of the disclosure. Generally described, the waveform diagram 200 includes a waveform illustrating the clock signal 210 and a waveform illustrating the sampling clock 220. (The waveforms are displayed in a time-ordered manner such that the leftmost portions of the waveform occur before the rightmost portions of the waveforms.)

Accordingly, the operation of the SAR ADC 138 includes an input sampling operation, which occurs during sampling period 222. The input sampling operation is followed by a serial conversion operation, which occurs during SAR operation 212. During the conversion operation, each bit is determined in a serial manner (e.g., one bit at a time). Each conversion cycle 230 includes a reset (RESET) phase (that occurs during reset period 232) that is followed by an amplification (AMP) phase that occurs during AMP period 234). The ADC clock signal 210 is not derived (e.g., directly) from the system PLL, but is independently generated and stabilized as described below.

The SAR ADC 138 is arranged to allow the variable number of clock cycles in the SAR operation 212, which allows a variable resolution (number of bits) and/or one or more additional clock cycles to occur during which digital decision error correction schemes operate. (Deriving the additional clock cycles—as well as deriving other system clocks—consistently and accurately from a single PLL, often requires a very high PLL base frequency, which usually entails additional costs and the power consumption.)

Figure 3:
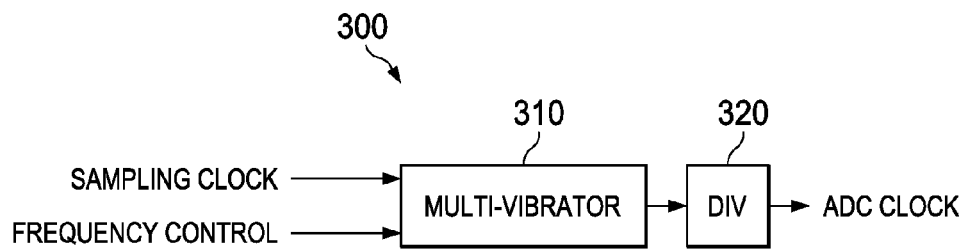
FIG. 3 is a high-level block diagram illustrating an adaptive clock generator in accordance with various embodiments of the disclosure.

FIG. 3 is a high-level block diagram illustrating an adaptive clock generator in accordance with various embodiments of the disclosure. The clock generator 300 is a clock generator such as the clock generator 140. The ADC clock generator 300 includes multi-vibrator 310 and divider (DIV) 320. The operation of clock generator 300 is now described with reference to FIG. 2 and FIG. 3.

Multi-vibrator 310 is arranged to generate a base frequency clock signal in response to the sampling clock 220 and a frequency control signal (described below). The base frequency clock signal that is output by the multi-vibrator 310 is divided by divider 320 to generate the ADC clock signal 210. Accordingly, the multi-vibrator 310 arranged to start generating the ADC clock signal 210 in response to the end of the sampling interval 222. The frequency of the multi-vibrator 310 is programmable to achieve a predetermined number of clock intervals between successive sampling periods 222.

The multi-vibrator 310 also allows arbitrary (e.g., programmable) control of the duty cycle of the ADC clock. The programmable duty cycle allows further optimization of both the reset time and amplification time in each (e.g., and every) conversion step.

The multi-vibrator 310 also allows the frequency to be dynamically changed during a conversion cycle (e.g., during SAR operation 212), which optimizes power and performance. For example, when the SAR ADC is operating in a mode in which a digital decision error correction scheme is used, additional time can be allocated to selected bits (e.g., least significant bits) to increase the conversion accuracy of each such bit. Dynamically changing the frequency of the ADC clock signal 210 permits larger decision errors in the first several conversion steps (e.g., for the most significant bits) and to gradually increase the conversion accuracy in later conversion steps (e.g., for the least-significant bits).

Performing the conversion steps more quickly during the initial conversion steps and then more slowly during the later conversion steps increases the accuracy of the entire conversion of the sample, decreases the overall time of SAR operation 212 (while maintaining or increasing accuracy of the entire conversion of the sample), and saves power (e.g., as compared with sampling each successive bit at high accuracies). In an embodiment, the multi-vibrator 310 is a low-power solution that operates using a few tens of micro-amperes of current. The operation of the adaptive clock generator is further described below with respect to FIG. 4.

Figure 4:
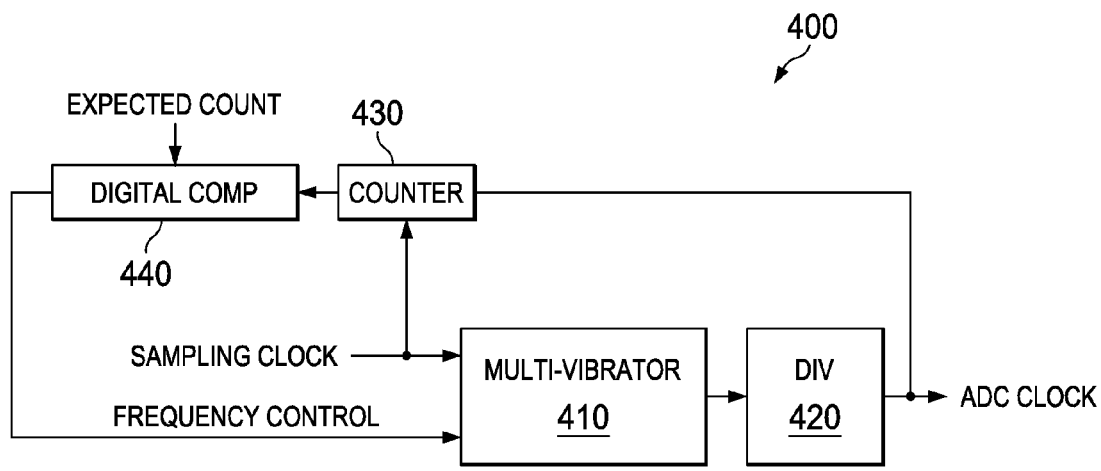
FIG. 4 is a block diagram illustrating an adaptive clock generator in accordance with various embodiments of the disclosure.

FIG. 4 is a block diagram illustrating an adaptive clock generator in accordance with various embodiments of the disclosure. Clock generator 400 includes a clock generator such as clock generator 300. The ADC clock generator 400 includes a multi-vibrator 410, a divider 420, the counter 430, and a digital comparator 440.

The adaptive clock generator 400 is arranged in a frequency-locked loop (FLL) configuration where the ADC clock signal 210 is used to generate the frequency control signal that is used as an input to multi-vibrator 410. In response to the sampling clock 220 and a frequency control signal the multi-vibrator 410 is arranged to generate a base frequency clock signal. The base frequency clock signal that is output by the multi-vibrator 410 is divided by divider 420 to generate the ADC clock signal 210.

The counter 430 is arranged to count the number of ADC clocks between two sampling clock edges. When the counter 430 value is less than the expected count, the digital comparator 440 adjusts the frequency control signal to gradually increase (e.g., to "nudge" the multi-vibrator frequency upwards) the frequency. When the counter 430 value is more than the expected count, the digital comparator 440 adjusts the frequency control signal to gradually decrease (e.g., to "nudge" the multi-vibrator frequency downwards) the frequency. (The operation of the digital comparator 440 is further discussed with reference to FIG. 9 below.)

As introduced in FIG. 2, each conversion cycle 230 includes a RESET phase (that occurs during reset period 232) that is followed by an amplification (AMP) phase that occurs during AMP period 234).

The length of the reset phase (of an ADC clock interval) is determined by the RC (resistive-capacitive impedance) settling within a digital-to-analog (DAC) architecture. More particularly, for a 12-bit ADC (for example) the length of the reset phase of the second conversion cycle is relatively important. The second conversion cycle is relatively important because the output of the DAC undergoes a step change of 1024 least significant bits (e.g., the magnitude of the least significant bit quantum multiplied by 2 raised to the $10^{th}$ power) at the start of reset phase during the second conversion cycle. The corresponding step size is progressively decreased as increasingly less-significant bits are successively converted (e.g., a step change of 512 least significant bits is used for the third bit, and smaller such step changes are used for each successive bit). Optimization of the length of the reset phase is described below with respect to FIG. 5 and FIG. 6.

The length of the amplification phase (of a clock interval) is determined by the net dynamic gain of the comparator pre-amplifier stages. The length of the amplification phase is typically more critical in the later conversion cycles (e.g., when digital correction techniques are used that provide coarse corrections, and accordingly make the initial more significant bits conversion decisions relatively less critical). Optimization of the length of the amplification phase is described below with respect to FIG. 5 and FIG. 7.

Figure 5:
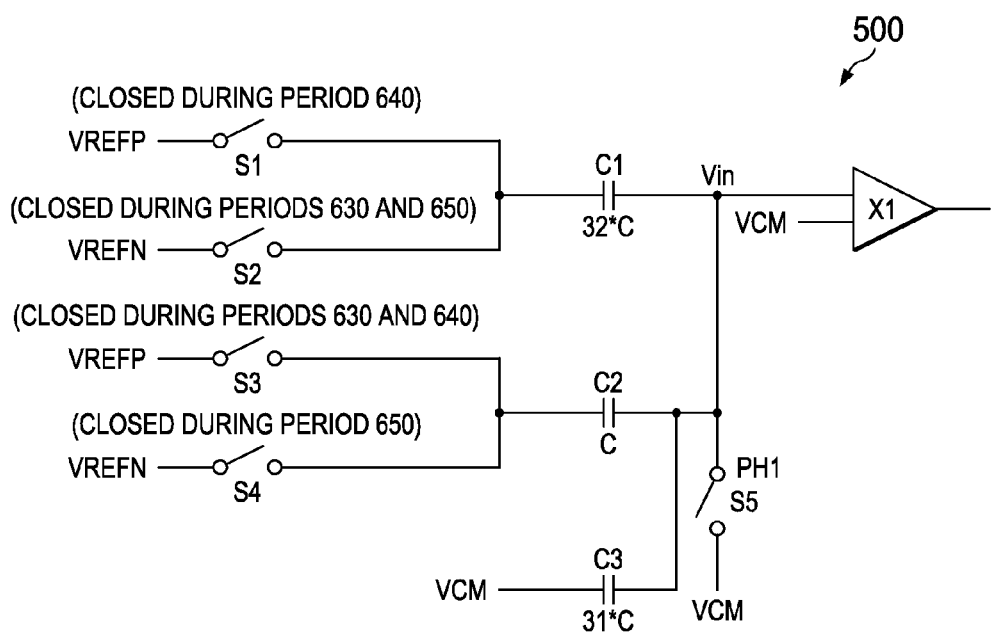
FIG. 5 is a schematic diagram illustrating ADC configuration during an initial calibration cycle in accordance with various embodiments of the disclosure.

FIG. 5 is a schematic diagram illustrating ADC configuration during an initial calibration cycle in accordance with example embodiments of the disclosure. Converter 500 is an ADC that is operable to for optimizing the duration of the reset phase. Converter 500 includes switches S1, S2, S3, S4, and S5, capacitors C1, C2, and C3, and comparator X1. Capacitor C1 has a first terminal that is coupled to a first input of comparator X1 (e.g., at node Vin). Capacitor C1 has a second terminal that is coupled to a positive reference voltage (VREFP) by switch S1 during a second converter period (discussed below with reference to FIG. 6) and that is coupled to a negative reference voltage (VREFN) by switch S2 during the first and third converter periods (also discussed below with reference to FIG. 6). Capacitor C1 has a capacitance value that is 32 times a unit capacitance (e.g., of a split-capacitor-architecture DAC).

Capacitor C2 has a first terminal that is coupled to the first input of comparator X1. Capacitor C2 has a second terminal that is coupled to a positive reference voltage (VREFP) by switch S3 during the first and second converter periods and that is that is coupled to a negative reference voltage (VREFN) by switch S4 during the third converter period. Capacitor C2 has a capacitance value that is approximately equal to the unit capacitance. Accordingly, a voltage quantity is sampled (e.g., stored as an analog sample at node Vin) and is operable for performing bit-wise conversions as described below with reference to FIG. 6.

Capacitor C3 has a first terminal that is coupled to the first input of comparator X1. Capacitor C3 has a second terminal that is coupled to a common mode voltage (VCM) reference. Capacitor C3 has a capacitance value that is approximately 31 times the unit capacitance. In an embodiment, capacitors C1, C2, and C3 are capacitor units that are used both in calibration and normal operation of the converter 500.

The second input of comparator X1 is coupled to the common mode voltage. Accordingly, comparator X1 is arranged to output a result of a comparison between the first and second inputs during the second phase (e.g. amplification phase) of each converter period. The comparison results as output by comparator X1 are used to optimize (e.g., calibrate) the length of the reset phase (and the length of the amplification phase) as discussed in the following figures.

Figure 6:
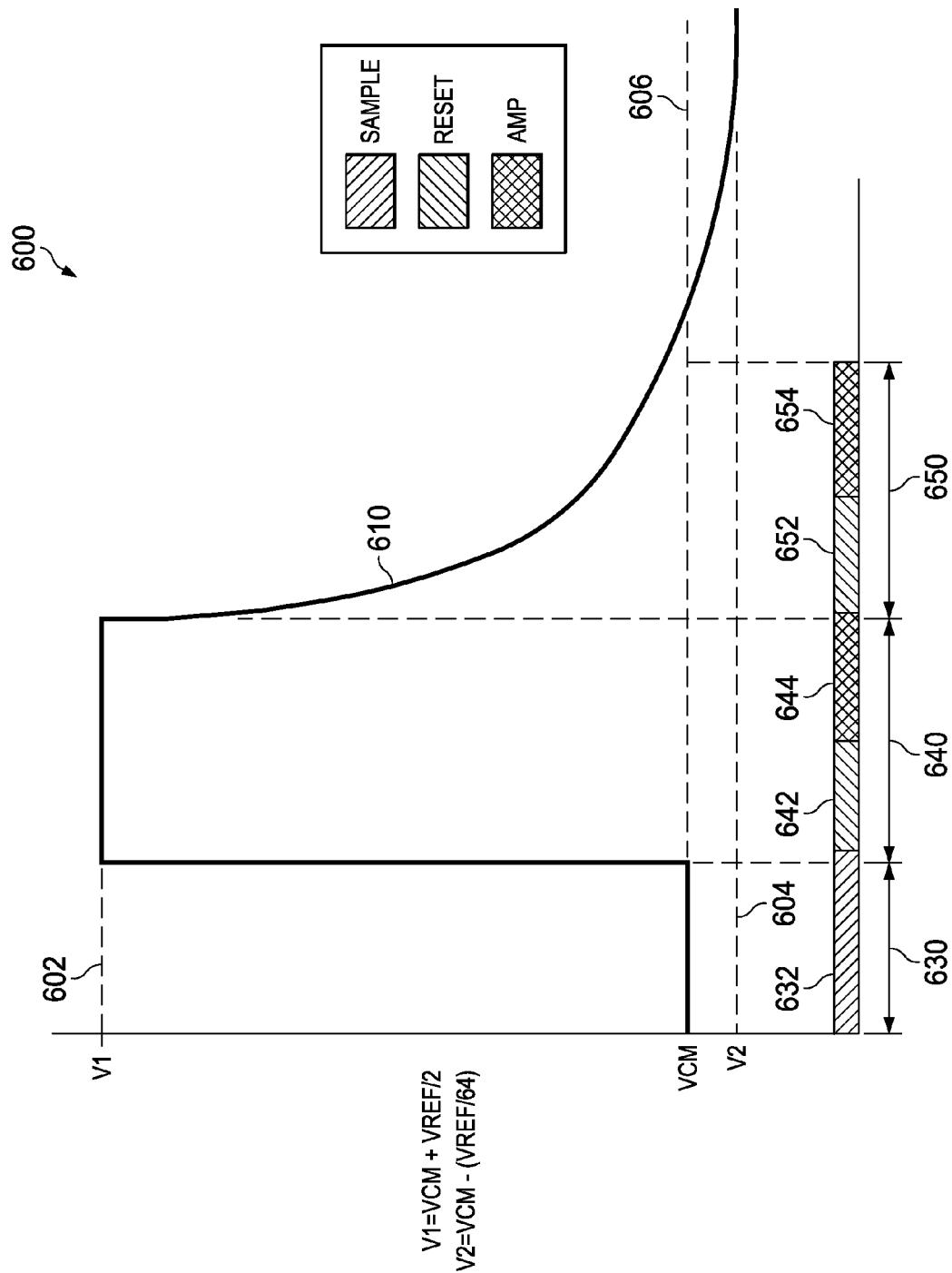
FIG. 6 is a waveform diagram illustrating a reset period calibration subroutine in accordance with example embodiments of the disclosure.

FIG. 6 is a waveform diagram illustrating a phase length calibration subroutine in accordance with example embodiments of the disclosure. Generally described, the waveform diagram 600 includes an input voltage waveform 610 illustrating the input voltage (e.g., of the first input of comparator X1) during each of the three converter periods 630, 640, and 650. (The waveforms are displayed in a time-ordered manner such that the leftmost portions of the waveform occur before the rightmost portions of the waveforms.) The operation of converter 500 is now discussed with reference to both FIG. 5 and FIG. 6.

The first converter period 630 includes a sampling phase 632 during which switch S2 and switch S3 are closed. The input voltage is substantially equal to the common mode voltage (606) by operation of switch S5 at this time. The first converter period 630 is followed by two consecutive conversions cycles that respectively occur during the second converter period 640 and the third converter period 650.

During the second converter period 640, switch S1 is toggled from open to closed (with switch S2 being toggled open) to cause the input voltage to take a large positive step (e.g., V1). The voltage V1 (602) is selected to be substantially larger than the common mode voltage and is determined in accordance with the formula VCM+VREF/2, where VREF is the magnitude of the voltages of VREFP and VREFN. The voltage V2 (604) is selected to be marginally less than the common mode voltage (VCM). The second converter period 640 includes a reset phase 642 that is followed by an amplification phase 644.

During the third converter period 650, switch S1 is toggled open (with switch S2 being toggled close) to cause the input voltage to take a large negative step (e.g., V2). The large negative step is larger than known large positives step by a known amount. The second converter period 640 includes a reset phase 642 that is followed by an amplification phase 644.

The difference between the large positive step and the large negative step is "delta V," which theoretically is the difference between the common mode voltage and voltage V2. Ideally, the comparator input voltage is expected to quickly jump to V2 (delta V below VCM) at the beginning of the third period. However, due to RC effects (for example) the input voltage waveform 610 settles slowly as indicated. As shown in the figure, the input does not reach V2 until a substantial time after the end of the third period. Decision error correction techniques are used to help compensate for this by allowing a large delta V. Accordingly, as long as the settling error at the end of the reset phase is less than delta V, the conversion is substantially correct. Referring to FIG. 6, this would mean that the input must at least reach VCM before the end of the reset phase in the third period.

To optimize the reset period (e.g., to find the shortest possible reset period during which accurate results are provided), the duration of the amplification phase is set to a constant and the reset period calibration subroutine is executed multiple times to determine whether the converter 500 provides a correct results. The reset period calibration subroutine is performed by varying the reset phase time (e.g., either in a binary search fashion or a linear search fashion) until the point is reached where toggling the length of the reset phase by one unit causes the comparator decision of converter 500 to toggle between right and wrong.

Each iteration of the reset period calibration subroutine can be executed in a consecutive manner or one or more iterations of the reset period calibration subroutine can be executed in an "interleaved" manner where one or more iterations of the phase length calibration subroutine are executed at convenient times (such as after the SAR operation 212 has finished, but before the next period. Accordingly, multiple samples in normal operation (e.g., with multiple sample periods and multiple SAR operation periods) can be performed while various iterations of the reset period calibration subroutine are performed during periods of time between times in normal operation occurs.

To optimize the amplification period (e.g., to find the shortest possible amplification period during which accurate results are provided), two example methods are disclosed. In a first example, the amplification period can be optimized by applying a 1-LSB input and checking the comparator output and progressively shrinking the amplification time until the comparator fails to make a proper decision (in a similar fashion, a binary search routine may be used). The confidence that the proper optimized length has been determined can be enhanced by using both a positive (+) 1-LSB step and a negative (−) 1-LSB step (in a linear or binary search pattern) to determine an optimal length of the amplification period.

The search for the optimum length of the amplification period (e.g., as described in the first example above) can be performed at the end of a normal conversion cycle (e.g., after SAR operation 212). Using programmable switches present in the CDAC 710, the bottom plates of the CDAC internal capacitors can be held to a current input value and the top plates of the CDAC internal capacitors reset to zero (which should be quick because the at this point in time the input is already close to zero). An extra unit capacitor can be toggled (as described in the first example above) to change the voltage of the input by the value of an LSB. However, the precision of this technique may be affected by comparator offset (although the comparator offset error can be at least partially compensated for by performing +1-LSB and −1-LSB amplification period length searches). The actual length of the amplification period that is to be used can be set to a value that is slightly greater (e.g., longer) than the amplification period determined from the results of amplification period length calibration searching.

Figure 7:
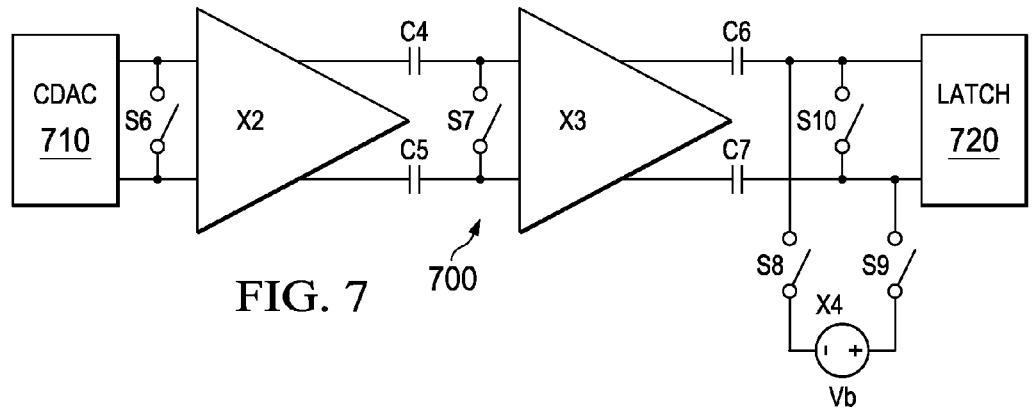
FIG. 7 is a high-level schematic illustrating an alternative amplification period calibration method in accordance with various embodiments of the disclosure.

FIG. 7 is a high-level schematic illustrating an alternative amplification period calibration method in accordance with various embodiments of the disclosure. Output system 700 includes a split-capacitor DAC (CDAC) 710 (for example), amplifiers X2 and X3, voltage source (Vb) X4, capacitors C4, C5, C6, and C7, and switches S6, S7, S8, S9, and S10.

In the output system 700, the amplification period is be optimized by using a special amplification period length calibration "auto-zero" (AZ) cycle in which a voltage −Vb is applied across the inputs of latch 720. For example, in a normal AZ cycle, the inputs to the latch 720 are forced to zero by closing switches S6, S7, and S10. During the amplification period length calibration auto-zero (AZ) cycle, instead of forcing the latch input to zero voltage as in a normal AZ cycle, the voltage negative (−)Vb (where Vb is the expected latch input voltage for a given small input step) is initially applied across the inputs of latch 720 by closing switches, S6, S7, S8 and S9.

After the preamplifiers X2 and X3 have been "auto-zeroed" using a value of −Vb, the internal capacitors of CDAC 710 are selected (e.g., selectively coupled) such that the value output by the CDAC 710 to the inputs of the preamplifiers assumes values that would result in the output of the preamplifier X3 being equal to Vb. If the dynamic gain of the preamplifier is more than the expected, the net input to the latch will typically be greater than zero (0). In various embodiments, effect of the latch offset voltage can be minimized by using input steps of larger than 1 LSB (e.g., 2, 3, or more LSBs) and setting the value of Vb accordingly.

In an example embodiment of a 12-bit ADC, the latch offset is normally around 12 mV and the preamplifier (X2 and X3) has been designed to amplify the value of 1 LSB to a value of around 30 mV (or more). In this example embodiment, the initial step of the CDAC is set to 3 LSBs and Vb is set to 90 mV.

The search for the optimum length of the amplification period (e.g., as described in the second example above) can be performed at the end of a normal conversion cycle (e.g., after SAR operation 212). By employing a linear search (e.g., performed over a relatively long period), the amplification period optimization search can slowly converge to a correct value by moving one (or a few steps) after each normal conversion cycle. Accordingly, a binary or linear search of the amplification period results can be performed until an optimal value for the amplification period length is determined.

Using adaptive clocking in accordance with a determined optimum reset period length and an optimum amplification period length allows for rapid conversions that are normally faster than conventional solutions. The rapid conversions save time (e.g., at least two or three standard ADC clock cycles) that can be used for performing additional calibration cycles, which help improve (or maintain) accuracy and speed of the conversions.

Figure 8:
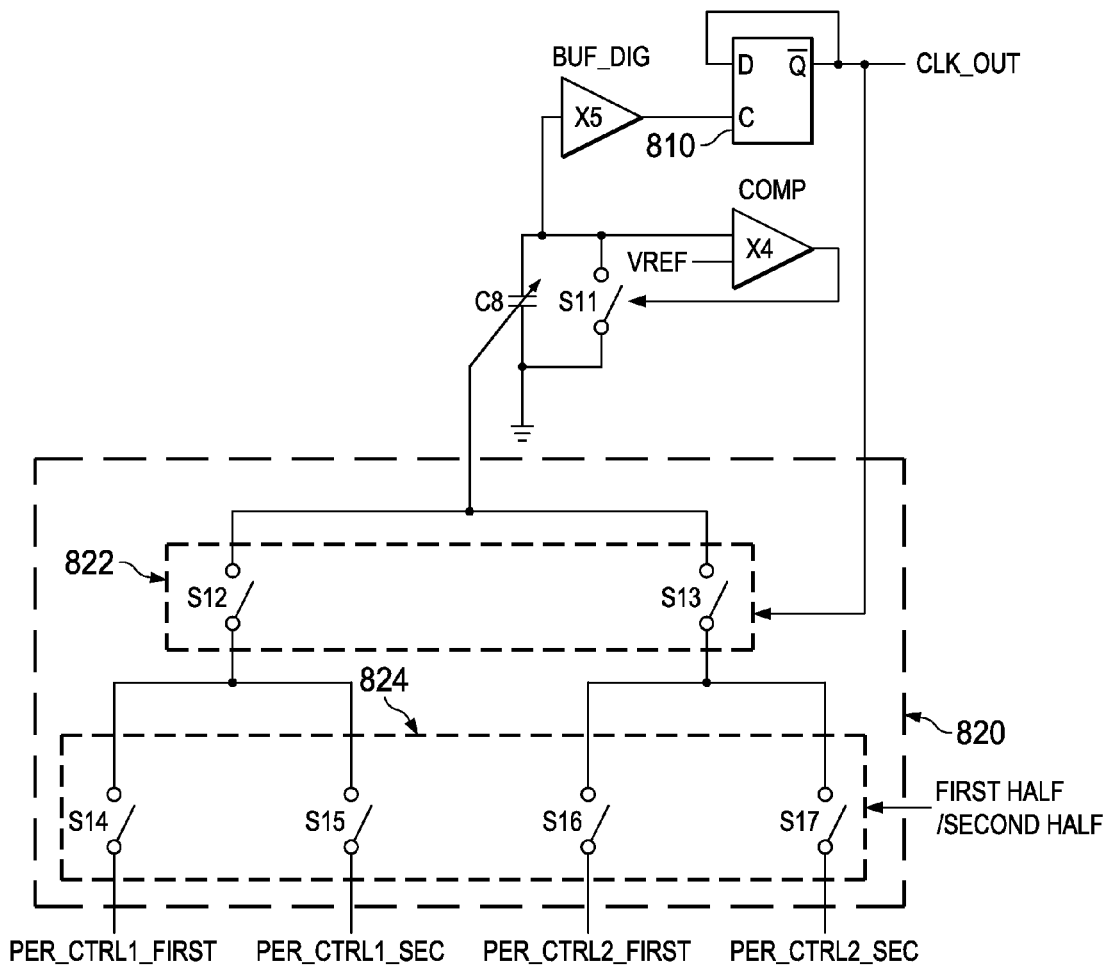
FIG. 8 is a schematic diagram illustrating a selective adaptive clock generator in accordance with various embodiments of the disclosure.

FIG. 8 is a schematic diagram illustrating a selective adaptive clock generator in accordance with various embodiments of the disclosure. Selective adaptive clock generator 800 includes a clock generator includes a (D-type) multi-vibrator 810, multiplexer 820, a comparator X4, a digital buffer X5, and a variable capacitor C8.

The selective adaptive clock generator 800 is arranged in a frequency-locked loop (FLL) configuration where the output (CLK_OUT) of multi-vibrator 810 is a base frequency (e.g., twice the frequency) of the ADC clock signal. The ADC clock signal is coupled to a first input of multiplexer 820 and is used to control switches S12 and S13 in an upper switch bank 822 of multiplexer 820. The upper switch bank 822 determines which period length value of the reset period length value and the amplification period length value is selected.

Multiplexer 820 also includes a second input that is coupled to the frequency control signal first half/second half. The frequency control signal first half/second half is coupled to control switches S14, S15, S16, and S17 in a lower switch bank 824 of multiplexer 820. The lower switch bank 824 determines whether coarsely adjusted period lengths (such as are used in a first portion of a normal conversion) or finely adjusted period lengths (such as are used in a second portion other normal conversion). The frequency control signal first half/second half is generated by digital comparator 440 as discussed below with reference to FIG. 9. (The duty cycle of the frequency control signal first half/second half is programmable such that the lengths of the first and second phase need not be of equal lengths; indeed, the frequency control signal first half/second half can be programmed to remain a constant value for duty cycles 0 percent or 100 percent.)

Multiplexer 820 is coupled to four programmably variable values (as discussed below with reference to FIG. 9), each of which is coupled to a respective input of each switch in the lower switch bank 824. The frequency control signal first half/second half is arranged to select between a reset period length for the first portion (PER_CTRL1_FIRST, e.g., used with shorter, but coarse, conversions) and the reset period length for the second portion (PER_CTRL1_SEC, e.g., used with longer, but more accurate, conversions). In similar fashion, the frequency control signal first half/second half is arranged to select between an amplification period length for the first portion (PER_CTRL2_FIRST, e.g., used with shorter, but coarse, conversions) and the amplification period length for the second portion (PER_CTRL2_SEC, e.g., used with longer, but more accurate, conversions).

Each selected input value (e.g., the selected reset period length and the selected amplification period length) of the lower switch banks 824 is coupled to a respective input of offer switch bank 822. As introduced above, the upper switch bank 822 selects one of the two inputs such that either the reset period length or the amplification period length is selected. The output of the upper switch bank 822 is coupled to the control input of variable capacitor C8.

Variable capacitor C8 is a split-capacitor DAC that affects the delay of the feedback loop formed (for example) by the output of the variable capacitor C8 being coupled to multivibrator 810 (via digital buffer BUF_DIG X5).

Figure 9:
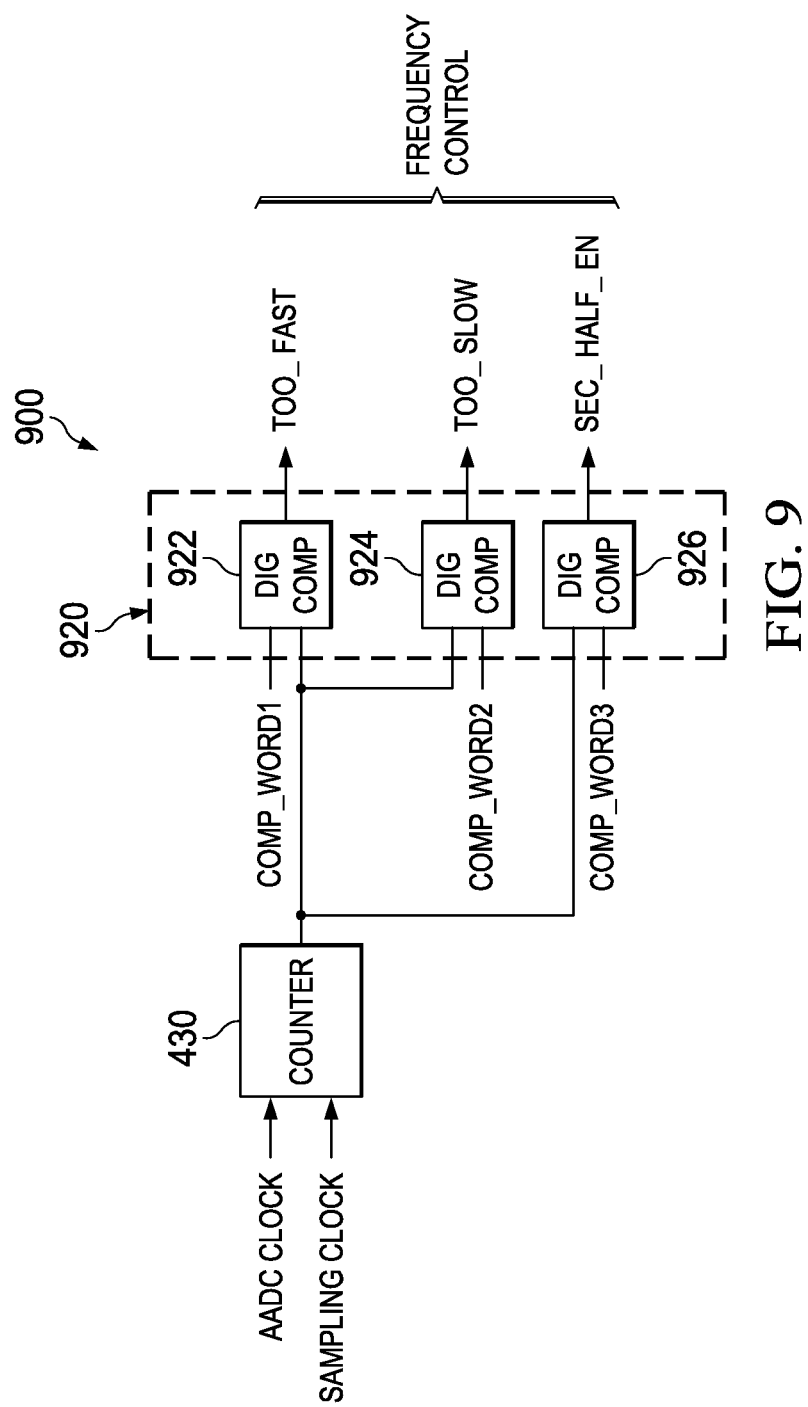
FIG. 9 is a schematic diagram illustrating frequency control generator for an ADC in accordance with various embodiments of the disclosure.

FIG. 9 is a schematic diagram illustrating frequency control generator for an ADC in accordance with various embodiments of the disclosure. Frequency control generator 900 includes a counter 430 and a digital comparator 440. As discussed above with reference to FIG. 4, the counter 430 counts a number of ADC clock cycles, where the current value of counter 430 is output to the digital comparator 414. The counter 430 can be reset by the sampling clock.

The digital comparator 440 includes digital comparators 922, 924, and 926. The digital comparator 922 includes a first input that is coupled to the counter 430 output, a second input that is coupled to a first threshold (COMP_WORD1), and an output (TOO_FAST) that is included in the frequency control (FREQ CONTROL) signals (discussed above with respect to FIG. 4).

In various embodiments, the above described components can be implemented in hardware or software, internally or externally, and share functionality with other modules and components as illustrated herein. For example, the successive approximation register (SAR) adaptive analog-to-digital converter 138 can be implemented outside of or upon a substrate (e.g., a silicon substrate or a circuit board) upon which the CPU 112 is located.

In an embodiment, a controller (e.g., such as a microcontroller or a digital signal processor) is used to control the frequency of the adaptive ADC clock and the various period lengths discussed above. The variables are software programmable, which allows more flexibility for implementing the disclosed control schemes and provides an enhanced ability to adaptively adjust to dynamically changing conditions for optimized system performance.

For example, control variables PER_CTRL1<3:0> and PER_CTRL2<3:0> are used for controlling the periods of the ON and OFF periods of the oscillator. Having independent control allows optimal allocation of time between the reset and amplification phases. PER_CTRL1 and PER_CTRL2 controls can be switched between two values. This allows the clock periods to be independently optimized for the coarse and fine (e.g., more accurate) conversions. In the basic mode, PER_CTRL1=PER_CTRL2 throughout the conversion cycle.

The PER_SCALE<3:0> controls can be used for scaling up/down the entire clock period (both the ON and OFF periods). The PER_SCALE<3:0> controls can be switched between two values. The PER_SCALE<3:0> controls are normally used to set the ratio between the clock frequency during the coarse and fine conversions in the FLL mode.

The COMP_WORD1 is set to the number of required clock pulses in a conversion cycle (18 in an example); COMP_WORD2 is set to be COMP_WORD1+1 (or 2); and COMP_WORD3 is set to the number of cycles allocated for the coarse conversion.

The PER_CTRL<3:0> is an oscillation control where the LSB=(33−12.5)/16 ns (nanoseconds) and the limits of the settings include:
1111 33 ns
0000 12.5 ns The PER_SCALE<3:0> scales the clock period in accordance with the below values:
0011=Nominal
0001=+20%
0000=+40%
0111=−20%
1111=−40%

Pseudo code for executing a normal conversion cycle is as follows:
Set PER_CTRL1_FIRST=PER_CTRL_SEC=PER_CTRL2_FIRST=PER_CTRL2_SEC=0111 (mid code)
Set PER_SCALE_FIRST<3:0>=PER_SCALE_SEC<3:0>=0011 (nominal)
Set COMP_WORD1=18
Set COMP_WORD2=19
Set COMP_WORD3>19; This will keep SEC_HALF_EN=0
If TOO_FAST=1, keep nudging PER_CTRL up until TOO_DAST flips to 0
If TOO_SLOW=1, keep nudging PER_CTRL down until TOO_SLOW flips to 0

The various embodiments described above are provided by way of illustration only and should not be construed to limit the claims attached hereto. Those skilled in the art will readily recognize various modifications and changes that could be made without following the example embodiments and applications illustrated and described herein, and without departing from the true spirit and scope of the following claims.

What is claimed is:

1. A converter, comprising:
 a comparator for sampling an analog quantity to store an analog sample during a sampling period and for performing a series of bit-wise conversions on the analog sample during a conversion period, wherein each bit-wise conversion occurs during a respective bit-wise conversion cycle in which successive bits of a sample are successively determined during a respective bit conversion cycle and in which a predetermined number of bit-wise conversions are to be performed; and a clock generator for generating a clock signal for clocking the converter during the conversion period, wherein each bit conversion cycle includes a reset period having a first length and an amplification period having a second length, wherein one of the first and second lengths is dynamically selected;

wherein the value of the first length is determined in a reset value calibration routine;

wherein the reset value calibration routine includes a sampling cycle, a first bit conversion cycle, and a second bit conversion cycle.

2. The converter of claim 1, wherein a first input of the comparator has a first value during the sampling cycle, a second value during the first bit conversion cycle, and a third value that during the second bit conversion cycle, wherein the second value has a voltage that is in between the first and third voltages, wherein the third value has a voltage that differs from the voltage of the second voltage by a first delta V (voltage) amount, and wherein the first voltage differs from the second voltage by a voltage difference that is at least several times the magnitude of the first delta V amount.

3. The converter of claim 2, wherein the first delta V amount exceeds the magnitude of 1 least significant bit (LSB).

4. The converter of claim 2, wherein the value of the first length is determined in response to evaluating the output of the comparator during successive iterations of the reset value calibration routine in which values for the first length are progressively changed.

5. The converter of claim 2, wherein iterations of the reset value calibration routine are performed between conversion periods.

6. The converter of claim 2, wherein the value of the second length is determined in an amplifier value calibration routine.

7. The converter of claim 6, wherein the amplifier calibration routine includes applying a 1-LSB input to the first comparator input and evaluating the output of the comparator during successive iterations of the reset value calibration routine in which values for the first length are progressively changed.

8. The converter of claim 6, wherein the amplifier calibration routine includes applying a Vb across the input of a latch arranged to latch an output of the converter.

9. The converter of claim 1, wherein the clock generator is arranged in a frequency locked-loop configuration.

10. The converter of claim 1, wherein the value of the second length is determined in an amplifier value calibration routine.

11. A conversion system, comprising:
a comparator formed on a substrate and operable for sampling an analog quantity to store an analog sample during a sampling period and operable for performing a series of bit-wise conversions on the sampled analog sample during a conversion period, wherein each bit-wise conversion occurs during a respective bit-wise conversion cycle in which successive bits of a sample are successively determined during a respective bit conversion cycle and in which a predetermined number of bit-wise conversions are to be performed;

a clock generator formed on the substrate and operable for generating a clock signal for clocking the converter during the conversion period, wherein each bit conversion cycle includes a reset period having a first length and an amplification period having a second length, wherein one of the first and second lengths is dynamically selected during the series of bit-wise conversions; and a processor for storing results of the series of bit-wise conversions, wherein the processor is responsive to a system clock derived from a phase-locked loop clock generator that is arranged in the substrate.

12. The converter of claim 11, wherein the clock generator operates independently of the system clock.

13. The converter of claim 12, wherein the clock generator does not operate in response to the system clock.

14. The converter of claim 13, wherein the value of the first length is determined in a reset value calibration routine, wherein the reset value calibration routine includes a sampling cycle, a first bit conversion cycle, and a second bit conversion cycle, wherein a first input of the comparator has a first value during the sampling cycle, a second value during the first bit conversion cycle, and a third value that during the second bit conversion cycle, wherein the second value has a voltage that is in between the first and third voltages, wherein the third value has a voltage that differs from the voltage of the second voltage by a first delta V (voltage) amount, and wherein the first voltage differs from the second voltage by a voltage difference that is at least several times the magnitude of the first delta V amount.

15. A conversion method, comprising:
sampling an analogy quantity during a sampling period and storing the sampled analog quantity as an analog sample;

performing a series of bit-wise conversions on the analog sample during a conversion period, wherein each bit-wise conversion occurs during a respective bit-wise conversion cycle in which successive bits of a sample are successively determined during a respective bit conversion cycle; and generating a clock signal for clocking the converter during the conversion period, wherein each bit conversion cycle includes a reset period having a first length and an amplification period having a second length, wherein one of the first and second lengths is dynamically selected during normal operation;

performing a predetermined number of bit-wise conversions during each respective bit-wise conversion cycle;

wherein the value of the first length is determined in a reset value calibration routine and wherein the reset value calibration routine includes a sampling cycle, a first bit conversion cycle, and a second bit conversion cycle.

16. The converter of claim 15, wherein the value of the second length is determined in an amplifier value calibration routine.

* * * * *